United States Patent
Jeantet et al.

(10) Patent No.: US 8,902,692 B2
(45) Date of Patent: Dec. 2, 2014

(54) DYNAMIC RANDOM ACCESS MEMORY DEVICE WITH IMPROVED CONTROL CIRCUITRY FOR THE WORD LINES

(75) Inventors: Olivier Jeantet, Saint Pierre de Chartreuse (FR); Marc Vernet, Montbonnot Saint Martin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 95 days.

(21) Appl. No.: 13/642,230

(22) PCT Filed: Apr. 12, 2011

(86) PCT No.: PCT/EP2011/055688
§ 371 (c)(1),
(2), (4) Date: Feb. 11, 2013

(87) PCT Pub. No.: WO2011/131511
PCT Pub. Date: Oct. 27, 2011

(65) Prior Publication Data
US 2013/0128677 A1    May 23, 2013

(30) Foreign Application Priority Data
Apr. 20, 2010   (FR) ..................... 10 52969

(51) Int. Cl.
| | |
|---|---|
| G11C 8/08 | (2006.01) |
| G11C 5/14 | (2006.01) |
| G11C 11/408 | (2006.01) |
| H01L 21/50 | (2006.01) |
| G11C 7/00 | (2006.01) |

(52) U.S. Cl.
CPC .. *G11C 7/00* (2013.01); *G11C 8/08* (2013.01); *G11C 11/4085* (2013.01); *H01L 21/50* (2013.01); *G11C 11/4087* (2013.01)
USPC ............ 365/230.06; 365/189.09; 365/189.11

(58) Field of Classification Search
CPC ........................................................ G11C 8/08
USPC ..................................................... 365/189.09
See application file for complete search history.

(56) References Cited

U.S. PATENT DOCUMENTS 5,363,338 A * 11/1994 Oh ........................... 365/230.06
5,412,331 A *  5/1995 Jun et al. ...................... 326/105
(Continued)

OTHER PUBLICATIONS

Chen et al, "A cost effective 32nm High-K/Metal Gate CMOS Technology for Low Power Applications with Single-Metal/Gate-First Process", 2008 Symposium on VLSI Technology Digest of Technical Papers.

(Continued)

*Primary Examiner* — Son Mai
(74) *Attorney, Agent, or Firm* — Allen, Dyer, Doppelt, Milbrath & Gilchrist, P.A.

(57) ABSTRACT

A dynamic random access memory device may include DRAM memory cells including several lines of memory cells, and line selection circuitry associated with each line. The line selection circuitry may include a first voltage-elevator stage configured to receive two initial control logic signals each having an initial voltage level corresponding to a first logic state, and to deliver two intermediate control logic signals each having an intermediate voltage level above the initial level and corresponding to the first logic state. The line selection circuitry may also include a control circuit to be supplied by PMOS transistors with a supply voltage having a second voltage level greater than the intermediate voltage level, and configured to, in the presence of the two intermediate control logic signals have their first logic state deliver to the gates of the memory cell transistors, a selection logic signal having the second voltage level.

20 Claims, 5 Drawing Sheets

(56) References Cited

U.S. PATENT DOCUMENTS

| | | | |
|---|---|---|---|
| 5,490,116 A | | 2/1996 | Tobita et al. |
| 5,602,797 A | * | 2/1997 | Kang ................. 365/230.06 |
| 5,781,481 A | * | 7/1998 | Iwakiri ............... 365/189.11 |
| 5,982,701 A | * | 11/1999 | Eto .................... 365/230.06 |
| 6,510,089 B2 | * | 1/2003 | Taura et al. ......... 365/189.11 |
| 7,283,406 B2 | * | 10/2007 | Lu et al. ............. 365/189.09 |
| 7,952,939 B2 | * | 5/2011 | Chen et al. .......... 365/189.09 |
| 2008/0291717 A1 | * | 11/2008 | Origasa .................. 365/149 |

OTHER PUBLICATIONS

Arnaud et al., "32nm General Purpose Bulk CMOS Technology for High Performance Applications at Low Voltage", Electron Devices Meeting, 2008; IEDM 2008, IEEE International, Dec. 15-17, 2008.

Kosuke Tatsumura et al., "Intrinsic Correlation between Mobility Reduction and Vt shift due to Interface Dipole Modulation in HfSiON/SiO2 stack by La or Al addition", IEICE Technical Report vol. 109 No. 87, SDM 2009-39, Jun. 2009.

\* cited by examiner

DYNAMIC RANDOM ACCESS MEMORY DEVICE WITH IMPROVED CONTROL CIRCUITRY FOR THE WORD LINES

FIELD OF THE INVENTION

The invention relates to dynamic random access memory devices known to the person skilled in the art by the acronym "DRAM", and, more particularly, to the control circuitry for the word lines of the memory plane.

BACKGROUND OF THE INVENTION

In a writing operation to a DRAM memory cell it may be desirable to apply a high voltage to the word line to which the cell is connected, so as to have a high gate-source voltage at the level of the cell's access transistor. This may allow, in particular, writing under good conditions while offering a relatively high refresh frequency. Thus, by way of indication, for advanced technologies, for example, technologies below 45 nanometers, in particular, 32 nanometers, obtaining a refresh frequency of 550 MHz may make it desirable to apply a line selection signal (voltage) of 2.5 volts to the word line.

Moreover, the generation of the line selection signal may be obtained based upon a combination of two control signals having a same voltage level (for example, 2.5 volts) as the voltage level desired to select the word line. These two control signals may be obtained respectively based upon two initial signals having a lower voltage level, for example, a nominal voltage level of 1 volt in a 32-nanometer technology. Finally, the generation of the two control signals having the high voltage level and the combining of these two control signals to obtain the line selection signal, are typically obtained with the aid of control circuitry comprising, in particular, voltage-elevator stages or level translators, buffer memories ("Buffers") and control elements ("Drivers"). This circuitry includes, in particular, dual-oxide re-channel (NMOS) transistors.

In particular, for advanced technologies, the admissible nominal voltage for dual-oxide NMOS transistors is typically relatively low, for example, 1.8 volts for the 32-nanometer technology. Consequently to generate control signals having a higher voltage level than the admissible nominal voltage, for example, a level of 2.5 volts, induces stresses in NMOS transistors, and this may lead, in the very short term, to oxide breakdown of these transistors, according to a phenomenon known to the person skilled in the art as time dependent dielectric breakdown (TDDB). Thus, by way of indication, in a 32-nanometer technology, the application of 2.5 volts to the selected word lines of the memory plane may lead to oxide breakdown of the NMOS transistors after two days and a few hours.

SUMMARY OF THE INVENTION

According to one embodiment, a memory device may reduce the risk of oxide breakdown, i.e. TDDB, of NMOS transistors while applying to the word lines to be selected, significant voltages greater than the admissible voltage of the NMOS transistors, thus making it possible to obtain high working frequencies, for example of the order of 550 MHz.

According to one embodiment, the voltage level for the line selection signal may be achieved by using two voltage-elevator stages and by applying the voltage stresses solely to p-channel metal oxide semiconductor (PMOS) transistors. Indeed, the inventors have observed that, for advanced technologies, typically below 45 nanometers, and, in particular, 32 nanometers and less, PMOS transistors were much less sensitive to the problems of oxide breakdown.

While the embodiments may be particularly beneficial for advanced technologies, for example, 32-nanometer technologies, it may also apply to all types of technologies, and even to less advanced technologies. Although in this case, the problem of oxide breakdown may be less critical with respect to the higher admissible maximum voltages of the NMOS transistors used.

According to one aspect, a dynamic random access memory device may include a memory plane comprising a set of DRAM memory cells comprising several lines of memory cells, and line selection means or circuitry associated with each line. According to a general characteristic of this aspect, the line selection means or circuitry comprises a first voltage-elevator stage configured to receive two initial control logic signals each having an initial voltage level, for example, 1 volt, corresponding to a first logic state, for example, the "1" logic state, and to deliver two intermediate control logic signals each having an intermediate voltage level, for example 1.8 volts, above the initial level and corresponding to the first logic state. The line selection means or circuitry may further comprise a control circuit with voltage elevation to be supplied via the PMOS transistors with a supply voltage having a second voltage level, for example 2.5 volts, greater than the intermediate level, and configured to, in the presence of the two intermediate control logic signals having their first logic state, deliver to the gates of the transistor of the memory cells of the line, a selection logic signal having the second voltage level, for example, 2.5 volts.

According to one embodiment, the control circuit comprises a group of NMOS transistors coupled to the first level-translator stage. The control circuit also includes a second level-translator stage connected to the group of NMOS transistors and comprising a first pair of PMOS transistors to be supplied by the supply voltage.

According to one embodiment, the first pair of PMOS transistors comprises a first and a second PMOS transistor each having its source configured to be connected to the supply voltage. The drain of each PMOS transistor is connected to the gate of the other PMOS transistor and the group of NMOS transistors. The drain of the first PMOS transistor is also coupled to the gates of the transistors of the memory cells of the line to deliver the selection signal.

According to one embodiment, in which each logic signal may have a low voltage level, for example, zero volts below the initial level, and corresponding to a second logic state, for example, the "0" logic level, the group of NMOS transistors comprises a first NMOS transistor whose gate is coupled to the first voltage-elevator stage to receive a first intermediate control signal, whose drain is connected to the drain of the second PMOS transistor, and whose source is configured to be at the low voltage level in the presence of a second intermediate control signal having the intermediate voltage level. The group of NMOS transistors also comprises a second NMOS transistor connected between the drain of the first PMOS transistor and the low voltage level, and whose gate is coupled to the first voltage-elevator stage to receive the inverse of the first intermediate control logic signal.

To reduce configurations in which the word line could be floating, for example, the group of NMOS transistors advantageously comprises a third NMOS transistor in parallel with the second NMOS transistor, and whose gate is coupled to the first voltage-elevator stage to receive the inverse of the second intermediate control logic signal. The source of the first NMOS transistor is coupled to the first voltage-elevator stage to receive the inverse of the second intermediate control logic signal.

To reduce the effects due to hot carrier injections, known to the person skilled in the art by the acronym "HCI", which may appear in the presence of a high source-drain voltage when a MOS transistor conducts, and which induce defects in the gate leading to degradations of the transistor, in one embodiment, the second level-translator stage may comprise a second PMOS transistor pair having their gate coupled to the first voltage-elevator stage and connected in series between the PMOS transistors of the first pair and the group of NMOS transistors.

According to one embodiment, the second pair of PMOS transistors comprises a third PMOS transistor connected between the drain of the first PMOS transistor of the first pair and the gate of the second PMOS transistor of the first pair, and a fourth PMOS transistor connected in series between the drain of the second PMOS transistor of the first pair and the gate of the first PMOS transistor of the first pair. The gate of the fourth PROS transistor is coupled to the first voltage-elevator stage to receive the first intermediate control logic signal, while the gate of the third PMOS transistor is coupled to the first voltage-elevator stage to receive the inverse of the second intermediate control logic signal. When the PMOS and NMOS transistors of the device are embodied in 32-nanometer technologies, the initial voltage level is 1 volt nominal, the intermediate voltage level is 1.8 volts nominal, and the second voltage level is 2.5 volts nominal.

DETAILED DESCRIPTION OF THE PREFERRED EMBODIMENTS

Figure 1:
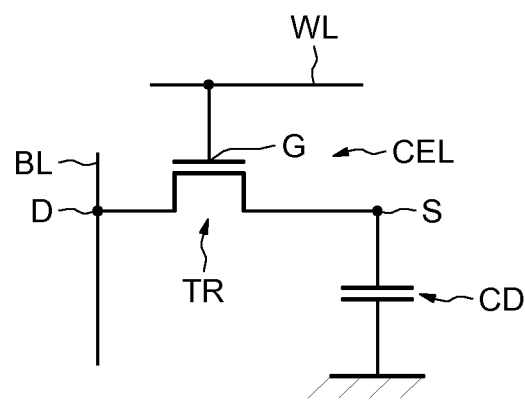
FIG. 1 is schematic diagram of an exemplary embodiment of a DRAM memory cell or memory point according to the present invention.

In FIG. 1, the reference CEL designates a DRAM memory cell comprising, in a conventional manner, an access transistor TR whose gate G is linked to a word line WL, whose drain D is connected to a bit line BL and whose source S is connected to a storage capacitor CD. Access transistors TR having threshold voltages VT sufficiently high to reduce charge leakage are preferably chosen. Thus for example, dual-oxide transistors, well known to the person skilled in the art, having threshold voltages of the order of 1 volt may be needed.

Moreover, in the case where the nominal supply voltage of the bit line is of the order of 1 volt, this being the case in 32-nanometer technologies, it is generally desirable to apply a voltage of the order of 2.5 volts to the gate of the transistor TR to have a gate-source voltage much greater than the threshold voltage, and thus have a relatively short write time. Thus, it may ultimately be possible to obtain a high working frequency for the memory.

Figure 2:
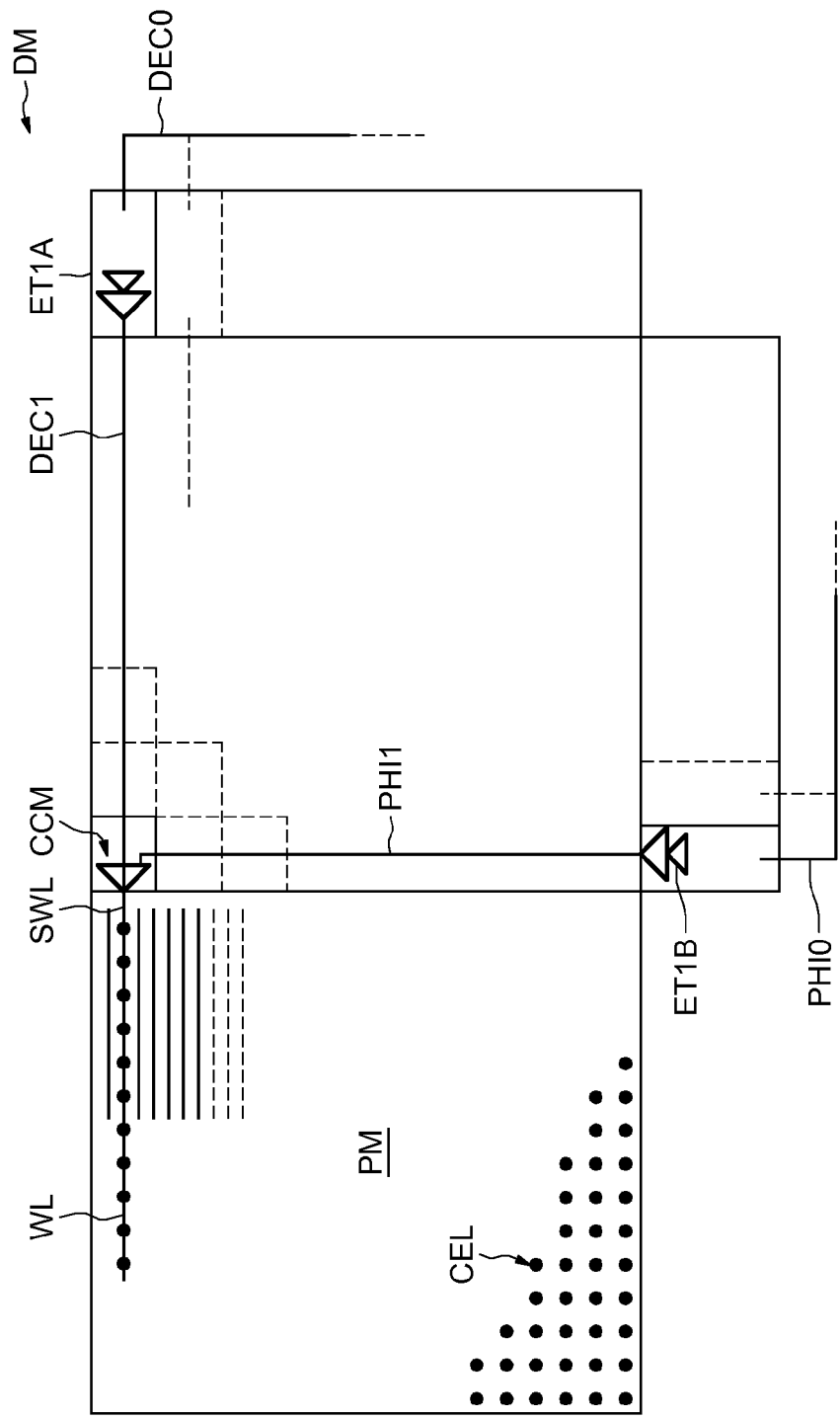
FIG. 2 is schematic diagram of a memory device according to the present invention.

The generation of the selection signal SWL delivered on the word line WL is, as illustrated in FIG. 2, obtained based upon line selection means or circuitry, associated with each line, and here comprising, as will be seen in greater detail hereinafter, a first voltage-elevator stage or level translator ET1A, ET1B and a control circuit CCM also with voltage elevation.

In FIG. 2, for simplification purposes, only the line selection means ET1A, ET1B and CCM associated with one line WL of the memory plane PM have been represented. Of course, there is a control circuit CCM per word line WL. Furthermore, there is a stage ET1A per line of control circuits CCM and a stage ET1B per column of control circuits CCM.

As will now be seen in greater detail, the first voltage-elevator stage, which includes the stages ET1A and ET1B, receives, respectively, two initial control signals DEC0 and PHI0. The stages ET1A and ET1B deliver intermediate control signals DEC1 and PHI1 and optionally their inverses. Finally, the control circuit CCM with voltage elevation combines the signals DEC1 and PHI1 to deliver the signal SWL. The selection of a word line WL is obtained when the two initial control signals DEC0 and PHI0 are in their "1" logic state, then having an initial voltage level which is the level of the supply voltage of the technology considered, for example, 1 volt in a 32-nanometer technology.

The intermediate signals DEC1 and PHI1 then have an intermediate voltage level greater than the initial level, for example, a voltage level of 1.8 volts. Finally, on an output from the control circuit CCM, the signal SWL has a second voltage level, greater than the intermediate level, for example, 2.5 volts, thereby corresponding to the level required for the selection of a memory cell CEL.

Figure 3:
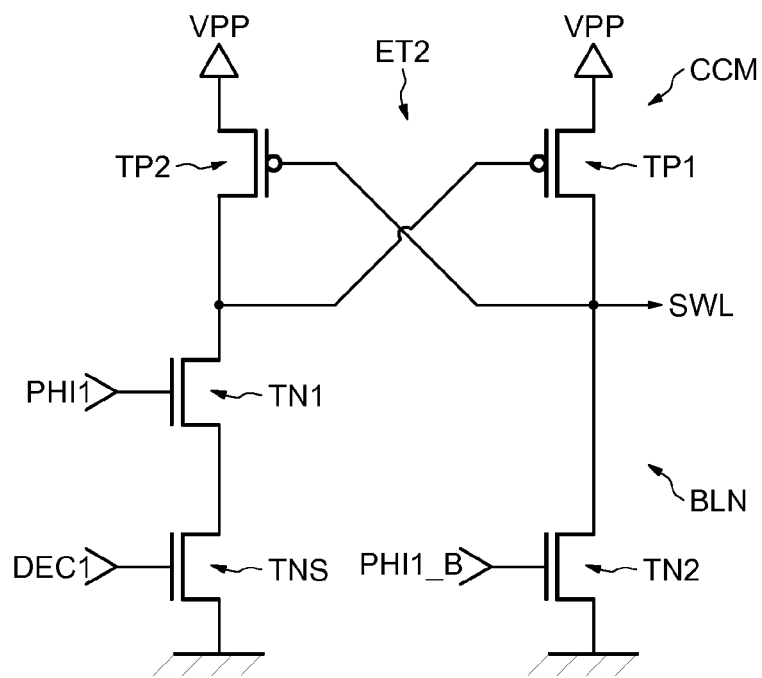
FIGS. 3 to 7 are schematic diagrams of parts of the memory device of FIG. 2 in greater detail.

FIG. 3 illustrates a first embodiment of a control circuit CCM. The latter comprises a group BLN of NMOS transistors coupled to the first level-translator stage ET1A, ET1B, and a second level-translator stage ET2 connected to the group BLN of NMOS transistors and comprising a first PMOS transistor TP1 and a second PMOS transistor TP2.

The source S of each PMOS transistor TP1 and TP2 is connected to a supply voltage VPP having the second voltage level, in this instance, 2.5 volts. The drain of each PMOS transistor is moreover connected to the gate of the other PMOS transistor. Moreover, the drain of the first PMOS transistor TP1 forms the output of the control circuit CCM and is consequently linked to the gates of the memory cells CEL of the word line WL to deliver the line selection signal SWL.

The group BLN of NMOS transistors here comprises a first NMOS transistor TN1 whose drain is connected to the drain of the second PMOS transistor TP2 and whose source is linked to ground, which is here a low voltage level, by way of an additional NMOS transistor TNS. The gate of the NMOS transistor TN1 is coupled to the stage ET1B to receive the intermediate control signal PHI1. Moreover, the gate of the additional NMOS transistor TNS is coupled to the stage ET1A to receive the intermediate control signal DEC1.

The group BLN of NMOS transistors moreover comprises a second NMOS TN2 whose drain is connected to the drain of the first PMOS transistor TP1, and whose source is connected to ground. This transistor TN2 has its gate coupled to the voltage-elevator stage ET1B to receive the inverse PHI1_B of the first intermediate control signal PHI1.

The operation of the circuit CCM is as follows. When it is desired to select the word line connected to the control circuit CCM, i.e. to deliver a signal SWL in a "1" logic state with a voltage level equal to 2.5 volts corresponding to the second voltage level, initial control signals DEC0 and PHI0 having the initial voltage level, typically 1 volt, corresponding to their "1" logic state, are input to the stages ET1A and ET1B. Therefore, the intermediate control signals PHI1 and DEC1 are in their "1" logic state with a voltage level equal to the intermediate level, i.e. in the present case 1.8 volts.

Consequently, the transistors TN1 and TNS are on, pulling the gate of the transistor TP1 to ground, thereby turning on this transistor TP1 and making it possible to deliver the signal SWL having the voltage VPP (2.5 volts). Moreover, the transistor TN2 is turned off just like the transistor TP2 which has the potential of its gate taken to the voltage VPP.

When the word line WL has to drop back to the low voltage level, i.e. ground, the signals DEC1 and PHI1 then have their low voltage level, typically 0 volts, corresponding to the "0" logic state. Therefore, the transistor TN2 is on, thereby pulling the word line WL to ground. The transistors TN1 and TNS are off. The transistor TP2 then turns on, thereby conveying the voltage VPP to the gate of the transistor TP1 and turning it off.

It is therefore seen that in all cases of operation, since the signals PHI1 and DEC1 vary between 0 volts and 1.8 volts, the NMOS transistors do not experience any stress that might lead to a phenomenon of the "TDDB" type even when the voltage VPP or ground are applied to one of the electrodes of these NMOS transistors.

On the other hand, a voltage level equal to VPP is solely applied to the PMOS transistors TP1 and TP2. But, as indicated hereinabove, these are less sensitive to the TDDB phenomena, in particular, when they are embodied in a 32-nanometer, or lower, logic technique, in which the gates of the transistors are generally metallic.

The fabrication of transistors in 32-nanometer technology may be well known to the person skilled in the art and the latter may, in this regard, refer to the following publications which mention transistors having metallic gates with dielectrics with high dielectric constant:
Chen et al, "A cost effective 32 nm High-K/Metal Gate CMOS Technology for Low Power Applications with Single-Metal/Gate-First Process", 2008 Symposium on VLSI Technology Digest of Technical Papers, Arnaud et al., "32 nm General Purpose Bulk CMOS Technology for High Performance Applications at Low Voltage", Electron Devices Meeting, 2008; IEDM 2008, IEEE International, 15-17 Dec. 2008, and Kosuke Tatsumura et al., "Intrinsic Correlation between Mobility Reduction and $V_t$ shift due to Interface Dipole Modulation in HfSiON/SiO$_2$ stack by La or Al addition", IEICE Technical Report Volume 109 No. 87, SDM 2009-39, June 2009.

In the embodiment which has just been described with reference to FIG. 3, there exists a situation in which the word line WL may be in a floating state. Such is the case when this line is not selected since the signal DEC1 is at 0 but in the presence of a signal PHI1 equal to 1, because another control circuit CCM of the same column is selected. To address this drawback, it may be possible to use the embodiment illustrated in FIG. 4, in which there may be placed, in parallel with the NMOS transistor TN2, a third NMOS transistor TN3 whose gate is coupled to the voltage-elevator stage ET1A to receive the inverse DEC1_B of the control signal DEC1. Thus, in the presence of a signal DEC1 having its "0" logic state, the transistor TN3 will be on, thus forcing the word line WL to drop back to ground even if the signal PHI1 is at "1".

Moreover, in the case where both signals PHI1 and DEC1 are at "0", the current resulting from the word line dropping from its voltage VPP to ground may advantageously be apportioned between the two transistors TN2 and TN3.

Figure 4:
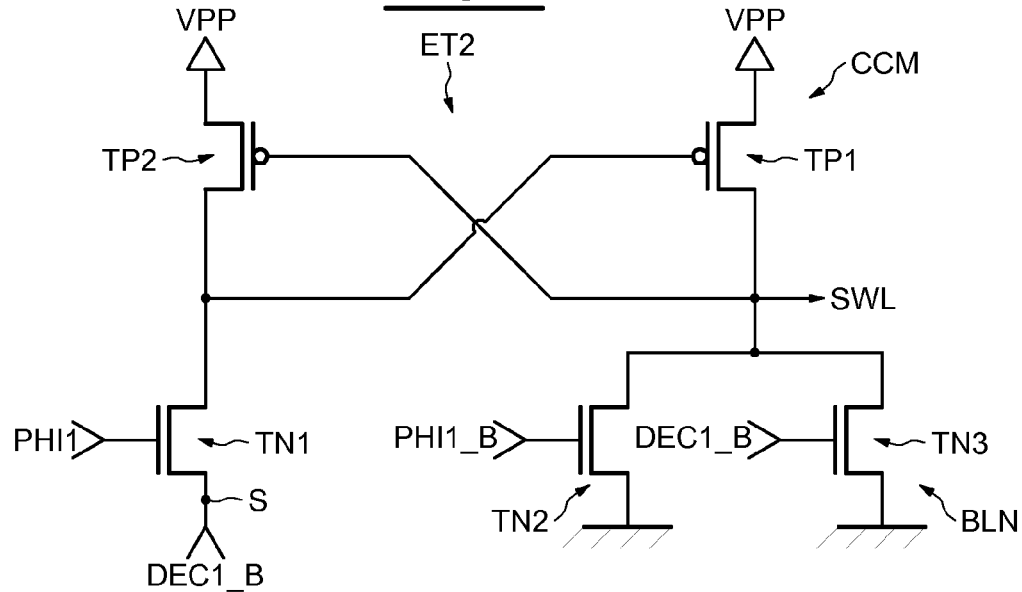

Finally, in the embodiment of FIG. 4, transistor TNS is not used. It may then be appropriate to apply the inverse DEC1_B of the signal DEC1 directly to the source of the transistor TN1. This allows a saving of one transistor per circuit CCM.

In the embodiments which have just been described, during the changes of state of the word line, the PMOS transistors take a certain time to turn off. During this transient period, a high short-circuit current flows through the PMOS and NMOS transistors until the PMOS transistors turn off totally.

Also, this short-circuit current induces hot carrier degradations in the NMOS transistors, degradations known by the acronym of hot carrier injection (HCI) degradation. These hot carrier degradations may create premature aging of the transistors, and this may cause delays in establishing the voltage levels in the word line.

Figure 5:
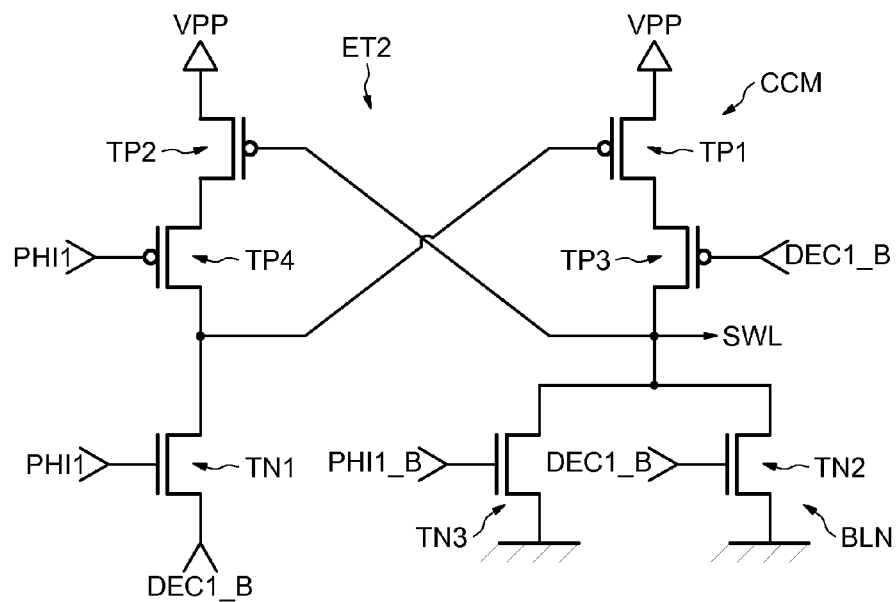

To address this drawback, as illustrated in FIG. 5, the second voltage-elevator stage ET2 comprises a second pair of PMOS transistors TP3 and TP4 stacked in series between the first pair of transistors TP1 and TP2 and the group BLN of NMOS transistors. More precisely, the second pair of PMOS transistors comprises a third PMOS transistor TP3 connected between the drain of the PMOS transistor TP1 and the gate of the PMOS transistor TP2, as well as a fourth PMOS transistor TP4 connected in series between the drain of the PMOS transistor TP2 and the gate of the PMOS transistor TP1. Moreover, the gate of the PMOS transistor TP3 is coupled to the first voltage-elevator stage to receive the inverse DEC1_B of the control signal DEC1 while the gate of the transistor TP4 is coupled to the first voltage-elevator stage to receive the signal PHI1.

With this arrangement, when, for example, the signals PHI1 and DEC1 are at "1" to raise the word line to the voltage VPP, the transistor TP3 is on, and the transistor TN1 is on, thereby turning on the transistor TP1 and actually raising the word line to the voltage VPP. On the other hand, the transistor TP4 is off, therefore avoiding a short-circuit between the voltage VPP and ground.

Likewise, when the signals PHI1 and DEC1 are at "0" to cause the word line to drop back to ground, the transistor TP4 is on, thereby making it possible to turn off the transistor TP1. On the other hand, the transistor TP3 is turned off, thereby here again avoiding a short-circuit between the voltage VPP and ground.

Figure 6:
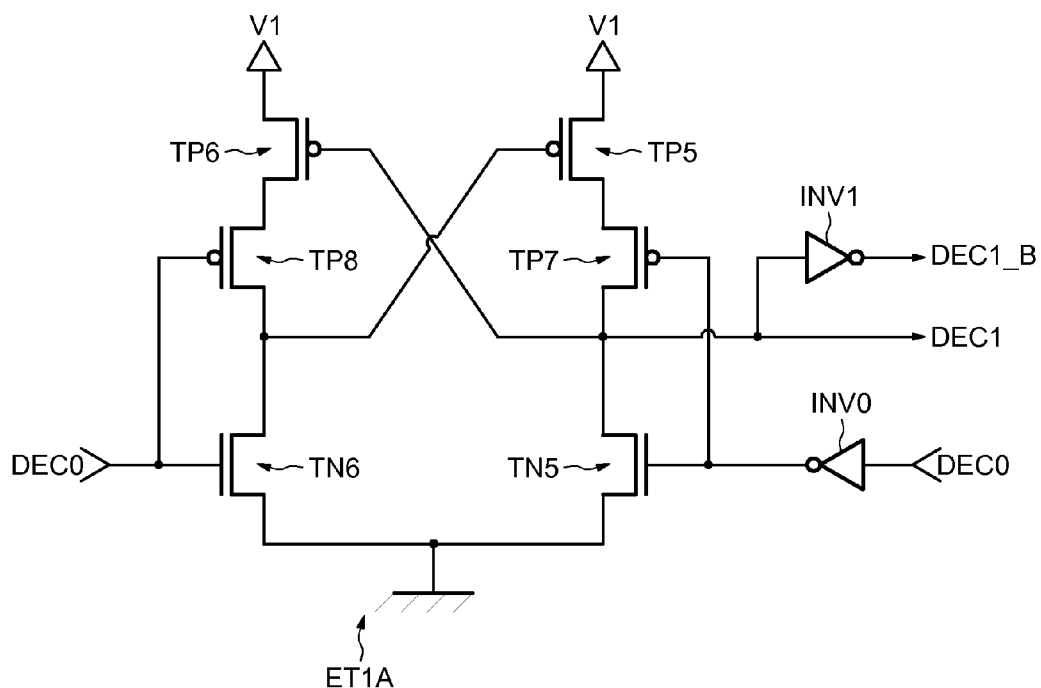
Figure 7:
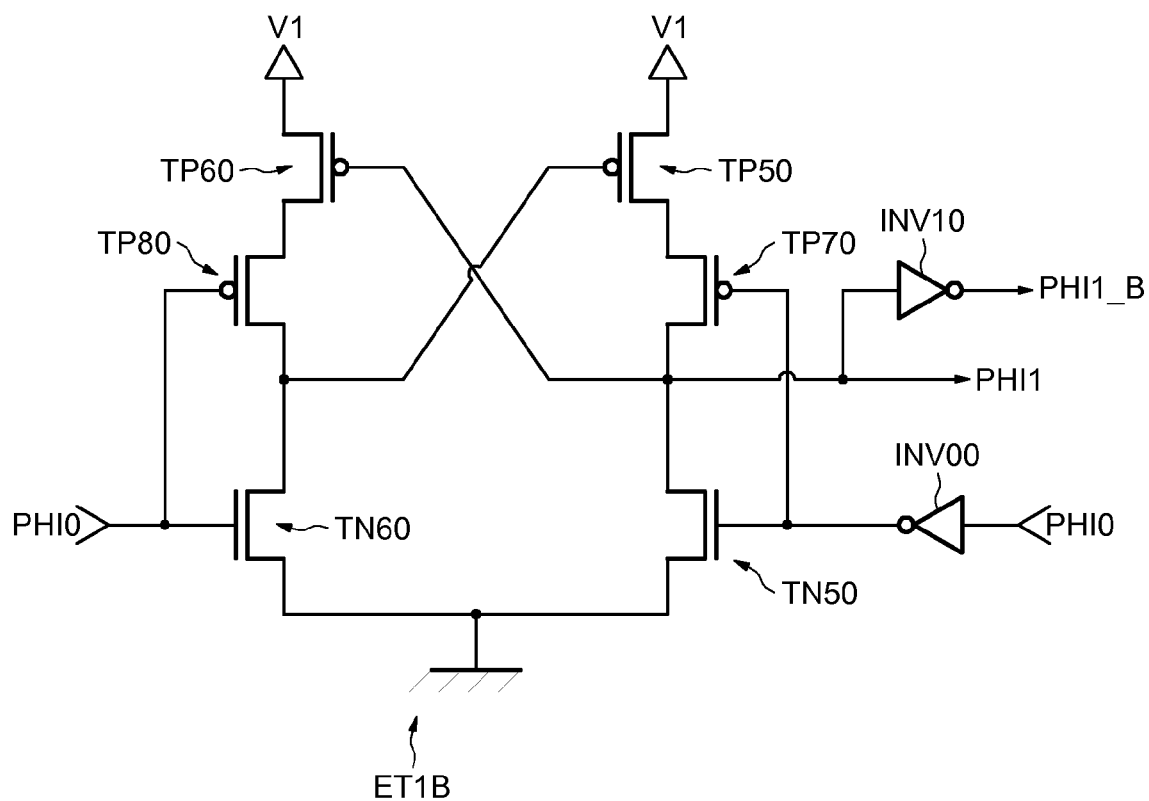

Regardless of the embodiment which has just been described, the first voltage-elevator stage formed of the modules ET1A and ET1B is formed of a level translator of conventional structure known per se, such as, for example, that illustrated in FIGS. 6 and 7. FIG. 6 illustrates the level translator of the stage ET1A, while FIG. 7 illustrates the level translator of the stage ET1B.

More precisely, as illustrated in FIG. 6, the stage ET1A comprises a pair of PMOS transistors TP5 and TP6, linked in a crossed manner by way of their gates. The input signal DEC0 is received on the gate of an NMOS transistor TN6 and at the input of an inverter INV0 connected to the gate of another NMOS transistor TN5. The output of the stage ET1A is formed by the drain of the transistor TN5 which delivers the signal DEC1, or else after passing through an inverter INV1, the inverse signal DEC1_B. Here again, two additional PMOS transistors TP7 and TP8 are used to reduce the problem of degradation by injection of hot carriers.

The structure of the stage ET1B illustrated in FIG. 7 is analogous to that of the stage ET1A. The difference is that this time, the stage ET1B receives the signal PHI0, instead of the signal DEC0, as input. In this figure the elements analogous to those illustrated in FIG. 6 have references increased by a final 0 with respect to the references of these same elements in FIG. 6.

It should be noted here that generally buffer memories (buffers as they are known to the person skilled in the art) are advantageously coupled at the output of the level translators of the stages ET1A and ET1B to reshape the output signals of these stages. These buffers have not been represented in the figures for simplification purposes. The embodiments exhibit the additional advantage of relaxing stress on these buffers since they are supplied by the intermediate voltage level (1.8 volts, for example). They generally do not therefore age prematurely because of TDDB and HCI phenomena.

Further, using two voltage-elevator stages and applying voltage stresses on PMOS transistors permits using two types of MOS transistors having, respectively, two different oxide thicknesses. More precisely, except transistors of the input inverters INV0 and INV00 which form the first type of transistors having thin oxides, all other transistors may form the second type of transistors having the same grid oxide thickness, which is greater than the oxide thickness of transistors of the first type. Transistors of the second type are, for example, double-oxide (thick oxide) transistors.

That which is claimed:

1. A random access memory device comprising:
a plurality of dynamic random access memory (DRAM) cells, and line selection circuitry associated therewith and comprising
a first voltage-elevator stage configured to receive two initial control logic signals each having an initial voltage level corresponding to a first logic state and to deliver first and second intermediate control logic signals each having an intermediate voltage level above the initial voltage level and corresponding to the first logic state, and
a control circuit comprising a first pair of PMOS transistors to be coupled with a supply voltage having a second voltage level greater than the intermediate level, said control circuit configured to, in the presence of the first and second intermediate control logic signals having their first logic state, deliver a selection logic signal having the second voltage level.

2. The random access memory device according to claim 1, wherein said control circuit comprises a plurality of NMOS transistors coupled to said first level-elevator stage and a second level-translator stage coupled to said plurality of NMOS transistors and comprising said first pair of PMOS transistors configured to be supplied by the supply voltage.

3. The random access memory device according to claim 2, wherein said plurality of DRAM memory cells comprise a plurality of transistors each having a gate; and wherein said first pair of PMOS transistors comprises first and second PMOS transistors each having a source to be coupled to the supply voltage, a drain, and a gate, the drain being coupled to the gate of the other PMOS transistor and the plurality of NMOS transistors, the drain of the first PMOS transistor being coupled to the gates of the transistors of said DRAM memory cells to deliver the selection logic signal.

4. The random access memory device according to claim 3, wherein each initial control logic signal has a low voltage level below the initial voltage level and corresponding to a second logic state; and wherein said plurality of NMOS transistors comprises a first NMOS transistor having a gate coupled to the first voltage-elevator stage to receive the first intermediate control signal, a drain coupled to the drain of the second PMOS transistor, and a source to be at the low voltage level in the presence of the second intermediate control signal having the intermediate voltage level, and a second NMOS transistor coupled between the drain of the first PMOS transistor and the low voltage level and having a gate coupled to the first voltage-elevator stage to receive an inverse of the first intermediate control logic signal.

5. The random access memory device according to claim 4, wherein said plurality of NMOS transistors comprises a third NMOS transistor coupled in parallel with said second NMOS transistor, and having a gate coupled to the first voltage-elevator stage to receive an inverse of the second intermediate control logic signal; and wherein the source of the first NMOS transistor is coupled to said first voltage-elevator stage to receive the inverse of the second intermediate control logic signal.

6. The random access memory device according to claim 2, wherein said second level-translator stage comprises a second pair of PMOS transistors each having a gate coupled to said first voltage-elevator stage, and coupled in series between said first pair of PMOS transistors.

7. The random access memory device according to claim 6, wherein said first pair of PMOS transistors comprises a first PMOS transistor and a second PMOS transistor each having a drain and a gate; and wherein said second pair of PMOS transistors comprises a third PMOS transistor coupled between the drain of the first PMOS transistor and the gate of the second PMOS transistor, and a fourth PMOS transistor coupled in series between the drain of the second PMOS transistor and the gate of the first PMOS transistor, the fourth PMOS transistor having a gate coupled to the first voltage-elevator stage to receive first intermediate control signal, said third PMOS transistor having a gate coupled to the first voltage-elevator stage to receive an inverse of the second intermediate control logic signal.

8. The random access memory device according to claim 2, wherein said plurality of NMOS transistors comprises a plurality of 32 nanometer technology NMOS transistors; and wherein the initial voltage level is 1 volt nominal, the intermediate voltage level is 1.8 volts nominal, and the second voltage level is 2.5 volts nominal.

9. A memory device comprising:
a plurality of memory cells and line selection circuitry associated therewith and comprising
a first voltage-elevator stage configured to receive first and second initial control logic signals, each having an initial voltage level corresponding to a first logic state and to deliver first and second intermediate control logic signals, each having an intermediate voltage level above the initial voltage level and corresponding to the first logic state, and
a control circuit configured to be coupled to a supply voltage having a second voltage level greater than the intermediate voltage level, said control circuit configured to, based upon the first and second intermediate control logic signals having their first logic state, deliver a selection logic signal having the second voltage level.

10. The memory device according to claim 9, wherein said plurality of memory cells comprise a plurality of DRAM memory cells.

11. The memory device according to claim 9, wherein said control circuit comprises a plurality of NMOS transistors coupled to said first level-elevator stage and a second level-translator stage coupled to said plurality of NMOS transistors and comprising a first pair of PMOS transistors configured to be coupled to the supply voltage.

12. The memory device according to claim 11, wherein said plurality of memory cells comprise a plurality of transistors each having a gate; and wherein said first pair of PMOS transistors comprises first and second PMOS transistors each having a source coupled to the supply voltage, a drain, and a gate, each drain coupled to the gate of the other PMOS transistor and the plurality of NMOS transistors, the drain of the first PMOS transistor coupled to the gates of the plurality of transistors to deliver the selection logic signal.

13. The memory device according to claim 12, wherein each of the first and second initial control logic signals has a low voltage level below the initial voltage level and corresponding to a second logic state; and wherein said plurality of NMOS transistors comprises a first NMOS transistor having a gate coupled to the first voltage-elevator stage to receive the first intermediate control signal, a drain coupled to the drain of the second PMOS transistor, and a source to be at the low voltage level based upon the second intermediate control signal having the intermediate voltage level, and a second NMOS transistor coupled between the drain of the first PMOS transistor and the low voltage level and having a gate coupled to the first voltage-elevator stage to receive an inverse of the first intermediate control logic signal.

14. The memory device according to claim 13, wherein said plurality of NMOS transistors comprises a third NMOS transistor coupled in parallel with said second NMOS transistor, and having a gate coupled to the first voltage-elevator stage to receive an inverse of the second intermediate control logic signal; and wherein the source of the first NMOS transistor is coupled to said first voltage-elevator stage to receive the inverse of the second intermediate control logic signal.

15. The memory device according to claim 11, wherein said second level-translator stage comprises a second pair of PMOS transistors each having a gate coupled to said first voltage-elevator stage, and coupled in series between said first pair of PMOS transistors.

16. The memory device according to claim 15, wherein said first pair of PMOS transistors comprises a first PMOS transistor and a second PMOS transistor each having a drain and a gate; and wherein said second pair of PMOS transistors comprises a third PMOS transistor coupled between the drain of the first PMOS transistor and the gate of the second PMOS transistor, and a fourth PMOS transistor coupled in series between the drain of the second PMOS transistor and the gate of the first PMOS transistor, the fourth PMOS transistor having a gate coupled to the first voltage-elevator stage to receive first intermediate control signal, said third PMOS transistor having a gate coupled to the first voltage-elevator stage to receive an inverse of the second intermediate control logic signal.

17. A method of making a memory device comprising:
forming a plurality of memory cells and line selection circuitry associated therewith, forming the line selection circuitry comprising
   forming a first voltage-elevator stage configured to receive first and second initial control logic signals, each having an initial voltage level corresponding to a first logic state and to deliver first and second intermediate control logic signals, each having an intermediate voltage level above the initial level and corresponding to the first logic state, and
   forming a control circuit comprising a first pair of PMOS transistors to be coupled with a supply voltage having a second voltage level greater than the intermediate voltage level, the control circuit configured to, based upon the first and second intermediate control logic signals having their first logic state, deliver a selection logic signal having the second voltage level.

18. The method according to claim 17, wherein the plurality of memory cells comprise a plurality of DRAM memory cells.

19. The method according to claim 17, wherein forming the control circuit comprises forming a plurality of NMOS transistors coupled to the first level-elevator stage and a second level-translator stage coupled to the plurality of NMOS transistors and comprising the first pair of PMOS transistors configured to receive the supply voltage.

20. The method according to claim 19, wherein the plurality of memory cells comprise a plurality of transistors each having a gate; and wherein the first pair of PMOS transistors comprises first and second PMOS transistors each having a source to be coupled to the supply voltage, a drain, and a gate, the drain being coupled to the gate of the other PMOS transistor and the plurality of NMOS transistors, the drain of the first PMOS transistor being coupled to the gates of the transistors of the memory cells to deliver the selection logic signal.

* * * * *